United States Patent
Oshemkov et al.

(10) Patent No.: US 11,774,870 B2
(45) Date of Patent: Oct. 3, 2023

(54) METHOD FOR REMOVING A PARTICLE FROM A MASK SYSTEM

(71) Applicants: Carl Zeiss SMT GmbH, Oberkochen (DE); Carl Zeiss SMS Ltd., D.N. Misgav (IL)

(72) Inventors: Sergey Oshemkov, Karmiel (IL); Shao-Chi Wei, Weimar (DE); Joerg Frederik Blumrich, Jena (DE); Martin Voelcker, Koenigsbronn-Zang (DE); Thomas Franz Karl Scheruebl, Jena (DE)

(73) Assignees: Carl Zeiss SMT GmbH, Oberkochen (DE); Carl Zeiss SMS Ltd., D.N. Misgav (IL)

( * ) Notice: Subject to any disclaimer, the term of this patent is extended or adjusted under 35 U.S.C. 154(b) by 0 days.

(21) Appl. No.: 17/882,948

(22) Filed: Aug. 8, 2022

(65) Prior Publication Data
US 2023/0053667 A1  Feb. 23, 2023

(30) Foreign Application Priority Data
Aug. 10, 2021  (DE) .......................... 102021120747.9

(51) Int. Cl.
*G03F 7/00*  (2006.01)

(52) U.S. Cl.
CPC ................ *G03F 7/70925* (2013.01)

(58) Field of Classification Search
CPC . G03F 1/82; G03F 1/84; G03F 7/7085; G03F 7/70925
See application file for complete search history.

(56) References Cited

U.S. PATENT DOCUMENTS

| | | | |
|---|---|---|---|
| 6,573,978 B1 | 6/2003 | McGuire, Jr. | |
| 7,993,464 B2 | 8/2011 | LeClaire et al. | |
| 2006/0132747 A1 | 6/2006 | Singer et al. | |
| 2007/0013892 A1* | 1/2007 | Osawa | G03F 1/82 355/71 |
| 2007/0285635 A1* | 12/2007 | Yonekawa | G03B 27/52 355/53 |
| 2018/0074303 A1 | 3/2018 | Schwab | |
| 2020/0272058 A1 | 8/2020 | Bieling et al. | |
| 2021/0018853 A1* | 1/2021 | Cheng | G03F 7/70916 |

(Continued)

FOREIGN PATENT DOCUMENTS

| | | | | |
|---|---|---|---|---|
| DE | 102008009600 | 8/2009 | ............... | G02B 5/09 |
| DE | 102017220586 | 5/2019 | ............... | G02B 5/09 |

(Continued)

OTHER PUBLICATIONS

The Office Action issued by the German Patent Office for Application No. DE 10 2021 120 747.9, dated Feb. 25, 2022 (with English Translation).

*Primary Examiner* — Peter B Kim
(74) *Attorney, Agent, or Firm* — Fish & Richardson P.C.

(57) ABSTRACT

A method for removing particles from a mask system for a projection exposure apparatus, including the following method steps: detecting the particle in the mask system, providing laser radiation, and removing the particle by irradiating the particle with laser radiation. The wavelength of the laser radiation corresponds to that of used radiation used by the projection exposure apparatus.

24 Claims, 3 Drawing Sheets

(56) References Cited

U.S. PATENT DOCUMENTS

2022/0317562 A1* 10/2022 Liu .......................... G03F 1/62
2022/0413400 A1* 12/2022 Liao ................... G03F 7/70925

FOREIGN PATENT DOCUMENTS

| DE | 102020201482 | 8/2021 | ............... C03F 1/72 |
| EP | 1 614 008 B1 | 12/2009 | ............... G03F 7/20 |
| WO | WO-2021156380 A1 * | 8/2021 | |

* cited by examiner

METHOD FOR REMOVING A PARTICLE FROM A MASK SYSTEM

CROSS-REFERENCE TO RELATED APPLICATION

The present application claims priority from German patent application DE 102021120747.9, filed on Aug. 10, 2021, the entire content of which is herein incorporated by reference.

TECHNICAL FIELD

The invention relates to a method for removing a particle from a mask system.

BACKGROUND

A mask system is to be understood here in particular to mean a combination of a photolithographic mask and what is known as a pellicle. Such photolithographic masks are usually used in projection exposure apparatuses for semiconductor lithography for producing microstructured components, such as integrated circuits or LCDs (Liquid Crystal Displays).

In a lithography process or a microlithography process, an illumination system illuminates a photolithographic mask, a photomask, or simply a mask. The light passing through the mask or the light reflected by the mask is projected, by use of a projection optical unit, onto a substrate (e.g. a wafer) which is coated with a light-sensitive layer (photoresist) and fitted in the image plane of the projection optical unit in order to transfer the structure elements of the mask to the light-sensitive coating of the substrate. The masks must have a high level of cleanliness since any contamination falsifies the image representation of the mask and can thus lead to defects on the wafer.

For easier cleaning and to protect the masks, they are often covered with a thin membrane, the pellicle that was already mentioned above, which is connected to the mask via a frame. Despite all the precautions, however, particles still fall onto the pellicle and/or onto the mask, sometimes even between the mask and pellicle.

In the following text, the term "mask system" is to be understood to mean not only the variants with pellicles but also systems without pellicles.

U.S. Pat. No. 7,993,464 B2 discloses a method for removing particles from the mask with pulsed laser light, which is based on the principle of heating the mask and the heating of the particle caused thereby, i.e. the removal of the particle by indirect heating of the particle. In this case, laser light with a wavelength of over 8 μm is preferably used, which is particularly well absorbed by the mask. This has the disadvantage that the mask can be heated to above a critical temperature, which can lead to the mask being damaged. When a pellicle is used, it is then designed in such a way that it is transmissive for the laser light used to remove the particles. Alternatively, the laser light can be selected such that it is at least only partially absorbed by the pellicle. However, this has the disadvantage that the possible wavelengths of the lasers used are limited.

SUMMARY

An aspect of the present invention is to provide a method that eliminates the disadvantages of the prior art.

The aspect is achieved by a method having the features of independent claim 1. The dependent claims relate to advantageous developments and variants of the invention.

A method according to the invention for removing particles from a mask system for a projection exposure apparatus comprises the following method steps:
- detecting the particle in the mask system,
- providing laser radiation,
- removing the particle by irradiating the particle with laser radiation.

According to the invention, the wavelength of the laser radiation corresponds here to that of used radiation that is used by the projection exposure apparatus. The use of the wavelength of the used radiation for the laser radiation has the advantage that, owing to the system, the mask system only has a low absorption for the wavelength of the used radiation. As a result, damage to the mask system due to heating to above a critical temperature, which can lead to the destruction of the mask system, can be avoided. The laser for providing the laser radiation can be designed, for example, as a high harmonic generation laser (HHG laser) or as a free electron laser (FEL).

Furthermore, the laser radiation can have at least one ultra-short laser pulse. Ultra-short laser pulses within the meaning of the application lie in a range from 10 femtoseconds to 10 nanoseconds. In particular, the pulse duration can lie between 10 femtoseconds and 100 picoseconds. The ultra-short pulses have the advantage that the heating of the material in the region of the contact surface of the particle with the mask system can be minimized. As a result, as described further above, the risk of damaging the mask system due to heating is further minimized.

In addition, the mask system can comprise a mask and a pellicle, and the pellicle can be at least partially transparent to the laser radiation. The particles can in this case be located on the mask. The particle can, for example, have passed onto the mask during the manufacturing process or during the assembly of the pellicle and have been covered there by the pellicle. The particle can thus be removed by removing the pellicle and removing the particle from the mask, or by removing the particle through the pellicle (without removing the pellicle from the mask). Since the removal of the pellicle is highly complex, removal of the particle through the pellicle (without removing the pellicle from the mask) is preferred where possible. This is possible due to the at least partial transparency of the pellicle to the laser radiation described further above.

Otherwise, the particle can also be located on the pellicle. In this case, the particle can be directly irradiated by the laser radiation. Due to the ultra-short pulses, the pellicle itself is heated only minimally or not by the heating of the particle or by laser radiation reflected by the particle. As described further above, this has the advantage that damage to the pellicle or the mask due to heating can be minimized or excluded.

In a further embodiment of the invention, the laser radiation can have a wavelength of approximately 13.5 nm. This wavelength is preferably used for the used radiation in what is known as EUV lithography. The pellicle of the mask system is sensibly transparent to the used radiation. Even particles between the pellicle and the reticle can thus be removed with a wavelength of 13.5 nm, without the pellicle being affected.

In particular, the used radiation of the projection exposure apparatus can be used to remove the particles. This has the advantage that no additional light source is required to remove the particles, which has a positive effect on the production costs of the projection exposure apparatus or on the cleaning costs of the mask system.

In a further embodiment of the invention, an optical unit used to focus the laser radiation can be integrated in the projection exposure apparatus. This has the advantage over non-integrated optical units that the mask system does not need to be removed from the projection exposure apparatus. Furthermore, for example, a positioning stage used for imaging the mask in the projection exposure apparatus can be used to position the mask system when removing the particles. This reduces the effort involved in removing a particle, which can have a positive effect on costs.

BRIEF DESCRIPTION OF DRAWINGS

Exemplary embodiments and variants of the invention are explained in more detail below with reference to the drawing. In the figures.

DETAILED DESCRIPTION

In the following text, the essential components of a microlithographic projection exposure apparatus 1 are described first by way of example with reference to FIG. 1. The description of the basic construction of the projection exposure apparatus 1 and its components is here understood to be not limiting.

One embodiment of an illumination system 2 of the projection exposure apparatus 1 has, in addition to a radiation source 3, an illumination optical unit 4 for illuminating an object field 5 in an object plane 6. In an alternative embodiment, the light source 3 can also be provided as a separate module from the remaining illumination system. In this case, the illumination system does not comprise the light source 3.

A mask, also referred to as reticle 7, which is arranged in the object field 5, is exposed to light. The reticle 7 is held by a reticle holder 8. The reticle holder 8 is displaceable by way of a reticle displacement drive 9, in particular in a scanning direction.

Figure 1:
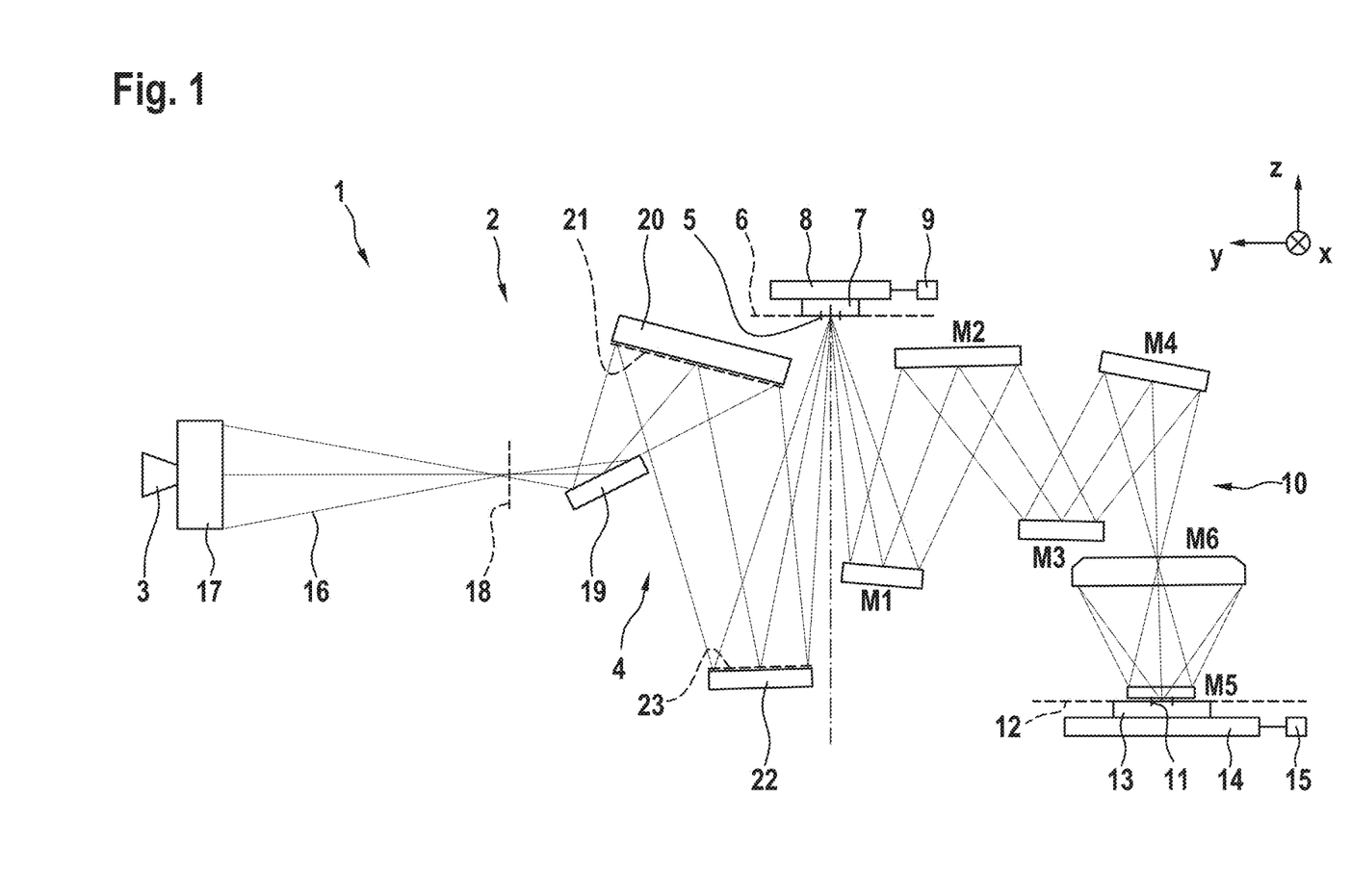
FIG. 1 schematically shows a meridional section of a projection exposure apparatus for EUV projection lithography, FIG. 2 schematically shows a meridional section of an apparatus for cleaning a mask to illustrate the method according to the invention.

A Cartesian xyz-coordinate system is shown in FIG. 1 for explanation purposes. The x-direction extends perpendicular to the plane of the drawing. The y-direction extends horizontally, and the z-direction extends vertically. The scanning direction extends along the y-direction in FIG. 1. The z-direction extends perpendicular to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle between the object plane 6 and the image plane 12 that differs from 0° is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable in particular along the y-direction by use of a wafer displacement drive 15. The displacement, firstly, of the reticle 7 by way of the reticle displacement drive 9 and, secondly, of the wafer 13 by way of the wafer displacement drive 15 can be implemented so as to be synchronized to one another.

In some implementations, the radiation source 3 is an EUV radiation source. The radiation source 3 emits, in particular, EUV radiation 16, which is also referred to below as used radiation, illumination radiation or illumination light. In particular, the used radiation has a wavelength in the range between 5 nm and 30 nm. The radiation source 3 can be a plasma source, for example an LPP source (Laser Produced Plasma) or GDPP source (Gas Discharge Produced Plasma). It can also be a synchrotron-based radiation source. The radiation source 3 can be a free electron laser (FEL).

The illumination radiation 16 emerging from the radiation source 3 is focused by a collector 17. The collector 17 can be a collector with one or with a plurality of ellipsoidal and/or hyperboloid reflection surfaces. The at least one reflection surface of the collector 17 can be impinged upon by illumination radiation 16 with grazing incidence (GI), i.e. at angles of incidence of greater than 45°, or with normal incidence (NI), i.e. at angles of incidence of less than 45°. The collector 17 can be structured and/or coated, firstly, for optimizing its reflectivity for the used radiation and, secondly, for suppressing extraneous light.

After the collector 17, the illumination radiation 16 propagates through an intermediate focus in an intermediate focal plane 18. The intermediate focal plane 18 can represent a separation between a radiation source module, having the radiation source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond a pure deflection effect. As an alternative or in addition thereto, the deflection mirror 19 can be embodied as a spectral filter separating a used light wavelength of the illumination radiation 16 from extraneous light having a wavelength that deviates therefrom. If the first facet mirror 20 is arranged in a plane of the illumination optical unit 4 that is optically conjugate to the object plane 6 as a field plane, said facet mirror is also referred to as a field facet mirror. The first facet mirror 20 comprises a multiplicity of individual first facets 21, which are also referred to as field facets below. Some of these facets 21 are shown in FIG. 1 only by way of example.

In some implementations, the first facets 21 can be embodied as macroscopic facets, in particular as rectangular facets or as facets with an arcuate contour or a contour of part of a circle. The first facets 21 can be embodied as plane facets or, alternatively, as convexly or concavely curved facets.

As is known from DE 10 2008 009 600 A1, for example, the first facets 21 can also each be composed of a multiplicity of individual mirrors, in particular a multiplicity of micromirrors. The first facet mirror 20 can in particular be designed as a microelectromechanical system (MEMS system). For details, reference is made to DE 10 2008 009 600 A1, the content of which is herein incorporated by reference.

The illumination radiation 16 travels horizontally, i.e. along the y-direction, between the collector 17 and the deflection mirror 19.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1 and U.S. Pat. No. 6,573,978. The contents of US 2006/0132747 and EP 1 614 008 are herein incorporated by reference.

The second facet mirror 22 comprises a plurality of second facets 23. In the case of a pupil facet mirror, the second facets 23 are also referred to as pupil facets.

The second facets 23 can likewise be macroscopic facets, which can, for example, have a round, rectangular or hexagonal boundary, or alternatively be facets composed of micromirrors. In this regard, reference is also made to DE 10 2008 009 600 A1.

The second facets 23 can have plane or, alternatively, convexly or concavely curved reflection surfaces.

The illumination optical unit 4 consequently forms a double-faceted system. This basic principle is also referred to as a fly's eye integrator.

It can be advantageous to arrange the second facet mirror 22 not exactly within a plane that is optically conjugate to a pupil plane of the projection optical unit 10. In particular, the pupil facet mirror 22 can be arranged so as to be tilted relative to a pupil plane of the projection optical unit 7, as is described, for example, in DE 10 2017 220 586 A1.

The individual first facets 21 are imaged into the object field 5 with the aid of the second facet mirror 22. In some examples, the second facet mirror 22 is the last beam-shaping mirror or, in fact, the last mirror for the illumination radiation 16 in the beam path upstream of the object field 5.

In a further embodiment of the illumination optical unit 4 (not illustrated), a transmission optical unit contributing in particular to the imaging of the first facets 21 into the object field 5 can be arranged in the beam path between the second facet mirror 22 and the object field 5. The transmission optical unit can have exactly one mirror or, alternatively, two or more mirrors, which are arranged in succession in the beam path of the illumination optical unit 4. The transmission optical unit can in particular comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the field facet mirror 20 and the pupil facet mirror 22.

The deflection mirror 19 can also be dispensed with in a further embodiment of the illumination optical unit 4, and the illumination optical unit 4 can then have exactly two mirrors downstream of the collector 17, specifically the first facet mirror 20 and the second facet mirror 22.

As a rule, the imaging of the first facets 21 into the object plane 6 by use of the second facets 23 or using the second facets 23 and a transmission optical unit is only approximate imaging.

The projection optical unit 10 comprises a plurality of mirrors Mi, which are numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The penultimate mirror M5 and the last mirror M6 each have a through opening for the illumination radiation 16. The projection optical unit 10 is a double-obscured optical unit. The projection optical unit 10 has an image-side numerical aperture that is greater than 0.5 and can also be greater than 0.6 and, for example, be 0.7 or 0.75.

Reflection surfaces of the mirrors Mi can be embodied as free-form surfaces without an axis of rotational symmetry. Alternatively, the reflection surfaces of the mirrors Mi can be designed as aspherical surfaces with exactly one axis of rotational symmetry of the reflection surface form. Just like the mirrors of the illumination optical unit 4, the mirrors Mi can have highly reflective coatings for the illumination radiation 16. These coatings can be designed as multilayer coatings, in particular with alternating layers of molybdenum and silicon.

The projection optical unit 10 has a large object-image offset in the y-direction between a y-coordinate of a center of the object field 5 and a y-coordinate of the center of the image field 11. In the y-direction, said object-image offset can be approximately the same size as a z-distance between the object plane 6 and the image plane 12.

In particular, the projection optical unit 10 can have an anamorphic design. In particular, it has different imaging scales $\beta x$, $\beta y$ in the x- and y-directions. The two imaging scales $\beta x$, $\beta y$ of the projection optical unit 10 preferably lie at $(\beta x, \beta y) = (+/-0.25, /+-0.125)$. A positive imaging scale $\beta$ means imaging without an image flip. A negative sign for the imaging scale $\beta$ means imaging with an image flip.

Consequently, the projection optical unit 10 leads to a reduction with a ratio of 4:1 in the x-direction, i.e. in a direction perpendicular to the scanning direction.

The projection optical unit 10 leads to a reduction of 8:1 in the y-direction, i.e. in the scanning direction.

Other imaging scales are likewise possible. Imaging scales with the same sign and the same absolute value in the x- and y-directions are also possible, for example with absolute values of 0.125 or 0.25.

The number of intermediate image planes in the x- and in the y-direction in the beam path between the object field 5 and the image field 11 can be the same or, depending on the embodiment of the projection optical unit 10, can be different. Examples of projection optical units with different numbers of such intermediate images in the x- and y-directions are known from US 2018/0074303 A1, the content of which is herein incorporated by reference.

In each case one of the pupil facets 23 is assigned to exactly one of the field facets 21 for forming in each case an illumination channel for illuminating the object field 5. In particular, this can produce illumination according to the Köhler principle. The far field is decomposed into a multiplicity of object fields 5 with the aid of the field facets 21. The field facets 21 produce a plurality of images of the intermediate focus on the pupil facets 23 respectively assigned thereto.

The field facets 21 are imaged, in each case by way of an assigned pupil facet 23, onto the reticle 7 in a manner such that they are superposed on one another for the purposes of illuminating the object field 5. The illumination of the object field 5 is in particular as homogeneous as possible. It preferably has a uniformity error of less than 2%. The field uniformity can be achieved by way of the superposition of different illumination channels.

The illumination of the entrance pupil of the projection optical unit 10 can be defined geometrically by way of an arrangement of the pupil facets. The intensity distribution in the entrance pupil of the projection optical unit 10 can be set by selecting the illumination channels, in particular the subset of the pupil facets, which guide light. This intensity distribution is also referred to as illumination setting.

A likewise preferred pupil uniformity in the region of sections of an illumination pupil of the illumination optical unit 4 that are illuminated in a defined manner can be achieved by a redistribution of the illumination channels.

Further aspects and details of the illumination of the object field 5 and, in particular, of the entrance pupil of the projection optical unit 10 are described below.

In particular, the projection optical unit 10 can have a homocentric entrance pupil. The latter can be accessible. It can also be inaccessible.

In some examples, the entrance pupil of the projection optical unit 10 cannot be illuminated regularly with the pupil facet mirror 22 in an exact manner. In the case of imaging the projection optical unit 10 in which the center of the pupil facet mirror 22 is telecentrically imaged onto the wafer 13, the aperture rays often do not intersect at a single point. However, it is possible to find an area in which the distance of the aperture rays determined in pairwise fashion becomes minimal. This area represents the entrance pupil or an area in real space that is conjugate thereto. In particular, this area has a finite curvature.

In some examples, the projection optical unit 10 might have different positions of the entrance pupil for the tangential beam path and for the sagittal beam path. In this case, an imaging element, in particular an optical component of the transmission optical unit, should be provided between the second facet mirror 22 and the reticle 7. With the aid of said optical element, the different positions of the tangential entrance pupil and the sagittal entrance pupil can be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is arranged so as to be tilted with respect to the object plane 6. The first facet mirror 20 is arranged so as to be tilted with respect to an arrangement plane defined by the deflection mirror 19.

The first facet mirror 20 is arranged so as to be tilted with respect to an arrangement plane defined by the second facet mirror 22.

Figure 2:
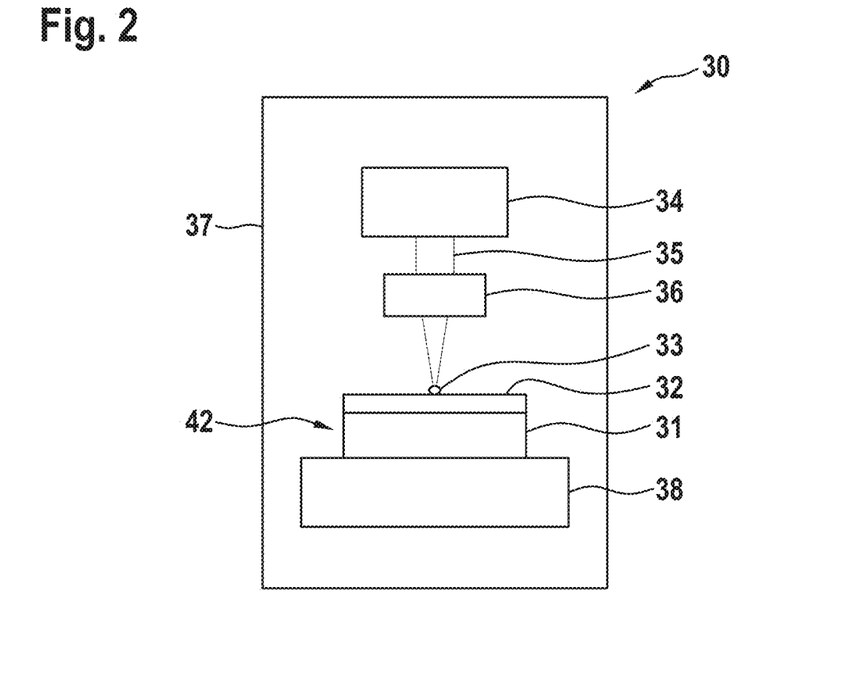

FIG. 2 shows a schematic construction of an apparatus 30 for removing a particle 33. The apparatus 30 comprises a vacuum chamber 37 with a laser 34 that is set up to emit ultra-short pulses with a wavelength of 13.5 nm. The pulses in this case have a pulse length in the range from 10 femtoseconds to 10 nanoseconds and preferably in the range from 10 femtoseconds to 100 picoseconds, wherein the pulse repetition frequency lies in a range from a single pulse to 1 MHz, preferably in a range from 10 Hz to 100 Hz. The energy density on the particle surface lies in a range from 0.01 to 10 J/cm$^2$ and preferably in the range from 0.1 to 1 J/cm$^2$. The wavelength used by the laser 34 corresponds to the wavelength of the used radiation 16 used in the projection exposure apparatus 1 (see FIG. 1) for imaging the structures (not shown) of the reticle 7.

The radiation 35 emitted by the laser 34 is focused by an optical system 36 onto the particle 33 to be removed, which has deposited on the pellicle 32. The particle 33 absorbs the laser radiation 35, heats up and evaporates. The radiation 35 that radiates past the particle 33 travels past the pellicle 32 that is transmissive for 13.5 nm and is reflected by the mask 31. This reduces the risk of damage to the pellicle 32 or the mask 31 to a minimum. The mask 31 and the pellicle 32 together form a mask system 42. The mask system 42 is arranged on a movement unit 38 that is set up to move and position the mask system 42 along three mutually orthogonal axes.

After a measurement and registration of the exact position of the particle 33 on the mask (not shown), the particle 33 can be positioned relative to the laser 34 in such a way that the particle 33 can be irradiated. This procedure also works for particles 33 that are located between the pellicle 32 and the mask 31, as described in FIG. 3.

The angle of incidence of the laser beam 35 can be designed in such a way that the latter is incident with grazing incidence with respect to the surface of the pellicle 32 in order to further minimize the risk of damage to the pellicle 32. Furthermore, the angle of incidence can be designed such that it is greater than the critical angle of total internal reflection for the pellicle-vacuum interface.

The optical system 36 of the laser 34 can be designed as a high-aperture optical unit, that is to say it can have a high numerical aperture, in order to allow close focusing on the particle 33.

The apparatus 30 can in principle be designed as an independent system, but is preferably designed as part of the projection exposure apparatus 1 of FIG. 1 in order to avoid removal of the mask 31 from the projection exposure apparatus 1.

The detection of a contamination and the removal of the particle 33 with the method according to the invention can be carried out at least partially with the components present in the projection exposure apparatus 1, for example the radiation source 3. All further required components are designed as additional modules in the projection exposure apparatus 1 and are used when necessary.

Figure 3:
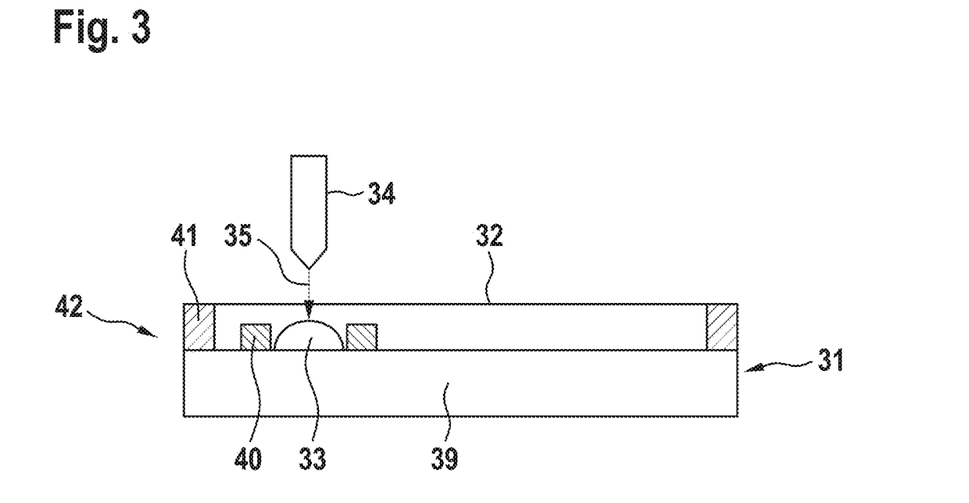
FIG. 3 shows a detailed view of the apparatus.

FIG. 3 shows a detailed view of the apparatus 30 for removing a particle 33 from a mask 31 by use of a laser 34. The mask 31 comprises a substrate 39 with a structure 40 for imaging onto a wafer (not shown) and a pellicle 32 stretched across a frame 41, wherein the frame 41 is arranged on the edge of the substrate 39. In the region of the structures 40, a particle 33 is adhered that is to be removed. The laser 34, which has a wavelength of 13.5 nm, as in FIG. 2, i.e. in the extreme ultraviolet wavelength range (EUV radiation), can be designed for example as a high harmonic generation laser (HHG laser) or as a free electron laser (FEL). The laser 34 is focused as described in FIG. 2 in such a way that the particle 33 is heated by absorbing the radiation 35 and is removed, for example, by evaporation. In this case, the laser 34 in the embodiment shown is arranged perpendicularly above the particle 33, wherein this position is used only for the basic illustration of the mode of operation. The light emitted by the laser 34 must be focused through the pellicle 32 onto the particle 33, which is why the angle of incidence of the laser beam 35 to the pellicle 32 should be designed in such a way that maximum transmission of the pellicle 32 is ensured. All other parameters of the laser, such as pulse length and pulse density, are as already described under FIG. 2.

Figure 4:
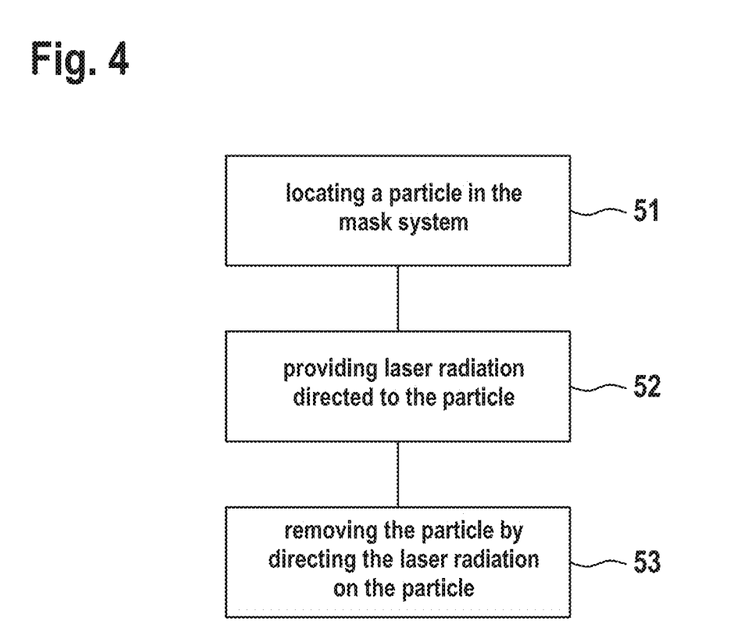
FIG. 4 shows a flowchart for a method according to the invention.

FIG. 4 shows a possible method for removing particles 33 in a mask system 31 of a projection exposure apparatus 1.

In a first method step 51, a particle 33 is detected in a mask system 31.

In a second method step 52, laser radiation 35 for irradiating the particle 33 is provided.

In a third method step 53, the particle 33 is removed by irradiation with the laser radiation 35.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

| List of reference signs: | |
|---|---|
| 1 | Projection exposure apparatus |
| 2 | Illumination system |
| 3 | Radiation source |
| 4 | Illumination optical unit |
| 5 | Object field |
| 6 | Object plane |
| 7 | Reticle |
| 8 | Reticle holder |
| 9 | Reticle displacement drive |
| 10 | Projection optical unit |
| 11 | Image field |
| 12 | Image plane |
| 13 | Wafers |
| 14 | Wafer holder |
| 15 | Wafer displacement drive |
| 16 | EUV radiation |
| 17 | Collector |
| 18 | Intermediate focal plane |
| 19 | Deflection mirror |
| 20 | Facet mirror |
| 21 | Facets |
| 22 | Facet mirror |
| 23 | Facets |
| 30 | Apparatus |
| 31 | Mask |
| 32 | Pellicle |
| 33 | Particle |
| 34 | Laser |
| 35 | Radiation |
| 36 | Optical system |
| 37 | Vacuum chamber |
| 38 | Movement unit |
| 39 | Substrate |
| 40 | Structure |
| 41 | Pellicle frame |
| 42 | Mask system |
| 51 | Method step 1 |
| 52 | Method step 2 |
| 53 | Method step 3 |

What is claimed is:

1. A method for removing particles from a mask system for a projection exposure apparatus, the mask system comprising a mask and a pellicle, the method comprising:
   detecting the particle on the pellicle in the mask system,
   providing laser radiation, and
   removing the particle by irradiating the particle on the pellicle with the laser radiation,
   wherein the wavelength of the laser radiation used by the projection exposure apparatus is also used as the wavelength of the laser radiation for removing the particle on the pellicle.

2. The method of claim 1,
   wherein the laser radiation has at least one ultra-short laser pulse.

3. The method of claim 2,
   wherein the pellicle is at least partially transparent to the laser radiation.

4. The method of claim 2, comprising:
   detecting a second particle on the mask in the mask system, and
   removing the second particle by irradiating the second particle on the mask with the laser radiation.

5. The method of claim 4,
   wherein the laser radiation has a wavelength of approximately 13.5 nm.

6. The method of claim 2,
   wherein the laser radiation has a wavelength of approximately 13.5 nm.

7. The method of claim 2,
   wherein the used radiation of the projection exposure apparatus is used to remove the particles.

8. The method of claim 7,
   wherein an optical unit used to focus the laser radiation is integrated in the projection exposure apparatus.

9. The method of claim 1,
   wherein the pellicle is at least partially transparent to the laser radiation.

10. The method of claim 1, comprising:
    detecting a second particle on the mask in the mask system, and
    removing the second particle by irradiating the second particle on the mask with the laser radiation.

11. The method of claim 10,
    wherein the laser radiation has a wavelength of approximately 13.5 nm.

12. The method of claim 1,
    wherein the laser radiation has a wavelength of approximately 13.5 nm.

13. The method of claim 1,
    wherein the used radiation of the projection exposure apparatus is used to remove the particles.

14. The method of claim 13,
    wherein an optical unit used to focus the laser radiation is integrated in the projection exposure apparatus.

15. A method comprising:
    providing a mask system comprising a mask and a pellicle;
    providing a projection exposure apparatus that comprises a laser source for providing laser radiation having a predetermined wavelength, an illumination optical unit for illuminating an object field in an object plane, and a projection optical unit for imaging the object field into an image field in an image plane, wherein the projection exposure apparatus is configured to use the laser radiation for imaging patterns on the mask onto a light-sensitive layer of a wafer;
    providing an optical unit used to focus the laser radiation on the mask system, wherein the optical unit is integrated in the projection exposure apparatus;
    detecting a first particle in the mask system; and
    removing the first particle by irradiating the first particle with the laser radiation.

16. The method of claim 15, wherein the laser radiation comprises at least one ultra-short laser pulse.

17. The method of claim 15, wherein the laser radiation has a wavelength of approximately 13.5 nm.

18. The method of claim 15, wherein the pellicle is at least partially transparent to the laser radiation.

19. The method of claim 18, wherein the first particle is located on the mask.

20. The method of claim 18, wherein the first particle is located on the pellicle.

21. The method of claim 19, comprising:
    detecting a second particle in the mask system, wherein the second particle is located on the pellicle; and
    removing the second particle by irradiating the second particle with the laser radiation.

22. The method of claim 15, wherein providing the laser radiation comprises using a free electron laser to provide the laser radiation.

23. The method of claim 15, wherein providing the laser radiation comprises directing the laser radiation toward the particle with grazing incidence with respect to a surface of the pellicle.

24. The method of claim 15, wherein providing the laser radiation comprises directing the laser toward the first particle with an angle of incidence with respect to the pellicle that is greater than the critical angle of total internal reflection for a pellicle-vacuum interface.

* * * * *